(12) United States Patent
Lee et al.

(10) Patent No.: US 9,773,861 B2
(45) Date of Patent: Sep. 26, 2017

(54) CAPACITORS AND SEMICONDUCTOR DEVICES INCLUDING THE SAME

(71) Applicant: Samsung Electronics Co., Ltd., Suwon-si, Gyeonggi-do (KR)

(72) Inventors: Hyun-Suk Lee, Suwon-si (KR); Jun-Goo Kang, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/064,253

(22) Filed: Mar. 8, 2016

(65) Prior Publication Data
US 2016/0380044 A1   Dec. 29, 2016

(30) Foreign Application Priority Data

Jun. 25, 2015   (KR) .................. 10-2015-0090208

(51) Int. Cl.
| | | |
|---|---|---|
| *H01L 29/94* | (2006.01) | |
| *H01L 49/02* | (2006.01) | |
| *H01L 27/06* | (2006.01) | |
| *H01L 27/108* | (2006.01) | |

(52) U.S. Cl.
CPC .......... *H01L 28/75* (2013.01); *H01L 27/0629* (2013.01); *H01L 28/90* (2013.01); *H01L 27/10852* (2013.01)

(58) Field of Classification Search
None
See application file for complete search history.

(56) References Cited

U.S. PATENT DOCUMENTS

| | | | | |
|---|---|---|---|---|
| 5,892,254 A | * | 4/1999 | Park | .................. H01L 21/76841 257/295 |
| 6,284,646 B1 | * | 9/2001 | Leem | ..................... C23C 16/52 257/E21.295 |
| 6,323,044 B1 | | 11/2001 | Harris et al. | |
| 6,335,557 B1 | * | 1/2002 | Kizilyalli | ................ H01L 28/75 257/301 |
| 6,358,810 B1 | * | 3/2002 | Dornfest | ................. H01L 28/60 257/E21.009 |

(Continued)

FOREIGN PATENT DOCUMENTS

| | | |
|---|---|---|
| JP | H11261028 A | 9/1999 |
| KR | 2000-0045274 A | 7/2000 |

(Continued)

*Primary Examiner* — Shaun Campbell
(74) *Attorney, Agent, or Firm* — Harness, Dickey & Pierce, P.L.C.

(57) ABSTRACT

A capacitor may include a lower electrode structure, a dielectric layer on the lower electrode structure, and an upper electrode on the dielectric layer. The lower electrode structure may include first to third lower electrodes sequentially stacked, a first oxidation barrier pattern structure between the first lower electrode and the second lower electrode, and a second oxidation barrier pattern structure between the second lower electrode and the third lower electrode. The first oxidation barrier pattern structure may include first and second oxidation barrier patterns sequentially stacked on the first lower electrode, and the second oxidation barrier pattern structure may include third and fourth oxidation barrier patterns sequentially stacked on the second lower electrode.

19 Claims, 14 Drawing Sheets

(56) References Cited

U.S. PATENT DOCUMENTS

| | | | |
|---|---|---|---|
| 6,590,251 B2 * | 7/2003 | Kang | C23C 16/34 |
| | | | 257/301 |
| 6,793,969 B2 | 9/2004 | Shimogaki et al. | |
| 7,405,121 B2 | 7/2008 | Wang | |
| 7,504,300 B2 | 3/2009 | Hwang | |
| 7,629,221 B2 | 12/2009 | Park et al. | |
| 8,343,844 B2 | 1/2013 | Kim et al. | |
| 8,373,212 B2 * | 2/2013 | Wang | H01L 27/11502 |
| | | | 257/295 |
| 2006/0006447 A1 * | 1/2006 | Kim | H01L 27/10852 |
| | | | 257/308 |
| 2006/0024883 A1 * | 2/2006 | Hwang | H01L 28/91 |
| | | | 438/253 |
| 2006/0273426 A1 * | 12/2006 | Iijima | H01L 21/3141 |
| | | | 257/532 |
| 2009/0021888 A1 * | 1/2009 | Jung | H01G 4/1227 |
| | | | 361/303 |

FOREIGN PATENT DOCUMENTS

| | | |
|---|---|---|
| KR | 2001-0061314 A | 7/2001 |
| KR | 10-0388456 B1 | 6/2003 |
| KR | 2004-0020172 A | 3/2004 |
| KR | 2006-0097306 A | 9/2006 |
| KR | 2009-0107293 A | 10/2009 |

* cited by examiner

CAPACITORS AND SEMICONDUCTOR DEVICES INCLUDING THE SAME

CROSS-REFERENCE TO RELATED APPLICATION

This application claims priority under 35 USC §119 to Korean Patent Application No. 10-2015-0090208, filed on Jun. 25, 2015 in the Korean Intellectual Property Office (KIPO), the contents of which are herein incorporated by reference in their entirety.

BACKGROUND

1. Field

The present disclosure relates to a capacitor and a semiconductor device including the same. More particularly, example embodiments relate to a capacitor having a metal-insulator-metal (MIM) structure and a semiconductor device including the same.

2. Description of the Related Art

Recently, as the integration degree of a semiconductor device increases, a size of a capacitor has been decreased. However, in consideration of the data input-output characteristics and the reproduction characteristics of the capacitor, the capacitor must have a capacitance more than a minimum capacitance. Accordingly, a cylindrical capacitor having a metal-insulator-metal (MIM) structure may be used.

However, when a dielectric layer including a high-k dielectric material is formed on a lower electrode to form a capacitor, the lower electrode may be oxidized by $O_3$ serving as a source gas, and thus the resistance of the capacitor may increase.

SUMMARY

Example embodiments provide a capacitor having good electrical characteristics.

According to example embodiments, a capacitor may include a lower electrode structure, a dielectric layer on the lower electrode structure, and an upper electrode on the dielectric layer. The lower electrode structure may include first to third lower electrodes sequentially stacked, a first oxidation barrier pattern structure between the first lower electrode and the second lower electrode, and a second oxidation barrier pattern structure between the second lower electrode and the third lower electrode. The first oxidation barrier pattern structure may include first and second oxidation barrier patterns sequentially stacked on the first lower electrode, and the second oxidation barrier pattern structure may include third and fourth oxidation barrier patterns sequentially stacked on the second lower electrode.

In some example embodiments, each of the first to fourth oxidation barrier patterns may include first and second oxidation barrier film patterns sequentially and alternately stacked.

In some example embodiments, at least one of the first and second oxidation barrier film patterns may have a multi-layered structure.

In some example embodiments, the first oxidation barrier film pattern may include titanium nitride and/or tantalum nitride.

In some example embodiments, the second oxidation barrier film pattern may include silicon nitride, tungsten nitride, and/or aluminum nitride.

In some example embodiments, a thickness of the second oxidation barrier film patterns may be greater than a thickness of the first oxidation barrier film patterns.

In some example embodiments, a thickness of the second oxidation barrier film patterns may be smaller than a thickness of the first oxidation barrier film patterns.

In some example embodiments, the first oxidation barrier film pattern may include a nitride of a first oxidation barrier material, and the second oxidation barrier film pattern may include a nitride of a second oxidation barrier material. The second oxidation barrier material may have an anti-oxidizing power than that of the first oxidation barrier material. A total content of the second oxidation barrier material of the second oxidation barrier pattern structures may be greater than a total content of the first oxidation barrier material of the first oxidation barrier pattern structures In some example embodiments, the first oxidation barrier material may include titanium and/or tantalum, and the second oxidation barrier material may include silicon, tungsten, and/or aluminum.

In some example embodiments, the first oxidation barrier film pattern may include a nitride of a first oxidation barrier material, and the second oxidation barrier film pattern may include a nitride of a second oxidation barrier material. The second oxidation barrier material may have an anti-oxidizing power greater than that of the first oxidation barrier material. A total content of the second oxidation barrier material of the second oxidation barrier pattern structures may be smaller than a total content of the first oxidation barrier material of the first oxidation barrier pattern structures.

In some example embodiments, the first oxidation barrier material may include titanium and/or tantalum, and the second oxidation barrier material may include silicon, tungsten, and/or aluminum.

In some example embodiments, the first to third lower electrodes may include titanium, tungsten, tantalum, titanium nitride, tungsten nitride, and/or tantalum nitride, respectively.

In some example embodiments, the first and third lower electrodes may include more oxygen than the second lower electrode.

In some example embodiments, each of the first and third lower electrodes may have an oxygen saturation of about 20% to about 60%.

In some example embodiments, the lower electrode structure may have a cylindrical shape.

According to example embodiments, a capacitor may include a lower electrode structure, a dielectric layer on the lower electrode structure, and an upper electrode on the dielectric layer. The lower electrode structure may include first to third lower electrodes sequentially stacked, a first oxidation barrier pattern structure between the first lower electrode and the second lower electrode, and a second oxidation barrier pattern structure between the second lower electrode and the third lower electrode. The first oxidation barrier pattern structure may include a first oxidation barrier material and a second oxidation barrier material. The second oxidation barrier pattern structure may include a third oxidation barrier material and a fourth oxidation barrier material. The second oxidation barrier material may have an anti-oxidizing power greater than that of the first oxidation barrier material. A content of the second oxidation barrier material of the first oxidation barrier pattern structure may decrease gradually from a bottom toward a top thereof, and a content of the fourth oxidation barrier material of the second oxidation barrier pattern structure may increase gradually from a bottom toward a top thereof.

In some example embodiments, the first oxidation barrier material may include titanium and/or tantalum, and the second oxidation barrier material may include silicon, tungsten, and/or aluminum. The first and second oxidation barrier pattern structures may include nitride, respectively.

In some example embodiments, each of the first and second oxidation barrier pattern structures may include a multi layers, respectively. A total content of the second oxidation barrier material in the first oxidation barrier pattern structure may decrease gradually from a bottom toward a top thereof, and a total content of the fourth oxidation barrier material in the second oxidation barrier pattern structure may increase gradually from a bottom toward a top thereof.

In some example embodiments, each of the oxidation barrier patterns may include first and second oxidation barrier film patterns sequentially and alternately stacked.

According to example embodiments, a semiconductor device includes a transistor on a substrate, and a capacitor electrically connected to the transistor. The capacitor may include a lower electrode structure, a dielectric layer on the lower electrode structure, and an upper electrode on the dielectric layer. The lower electrode may include first to third lower electrodes sequentially stacked, a first oxidation barrier pattern structure between the first lower electrode and the second lower electrode, and a second oxidation barrier pattern structure between the second lower electrode and the third lower electrode. The first oxidation barrier pattern structure may include first and second oxidation barrier patterns sequentially stacked on the first lower electrode, and the second oxidation barrier pattern structure may include third and fourth oxidation barrier patterns sequentially stacked on the second lower electrode.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device in accordance with example embodiments;

FIGS. 2 to 17 are cross-sectional views illustrating a method of manufacturing the semiconductor device shown in FIG. 1; and FIG. 18 is a block diagram illustrating a memory system including the semiconductor device shown in FIG. 1.

DESCRIPTION OF EMBODIMENTS

Figure 1:
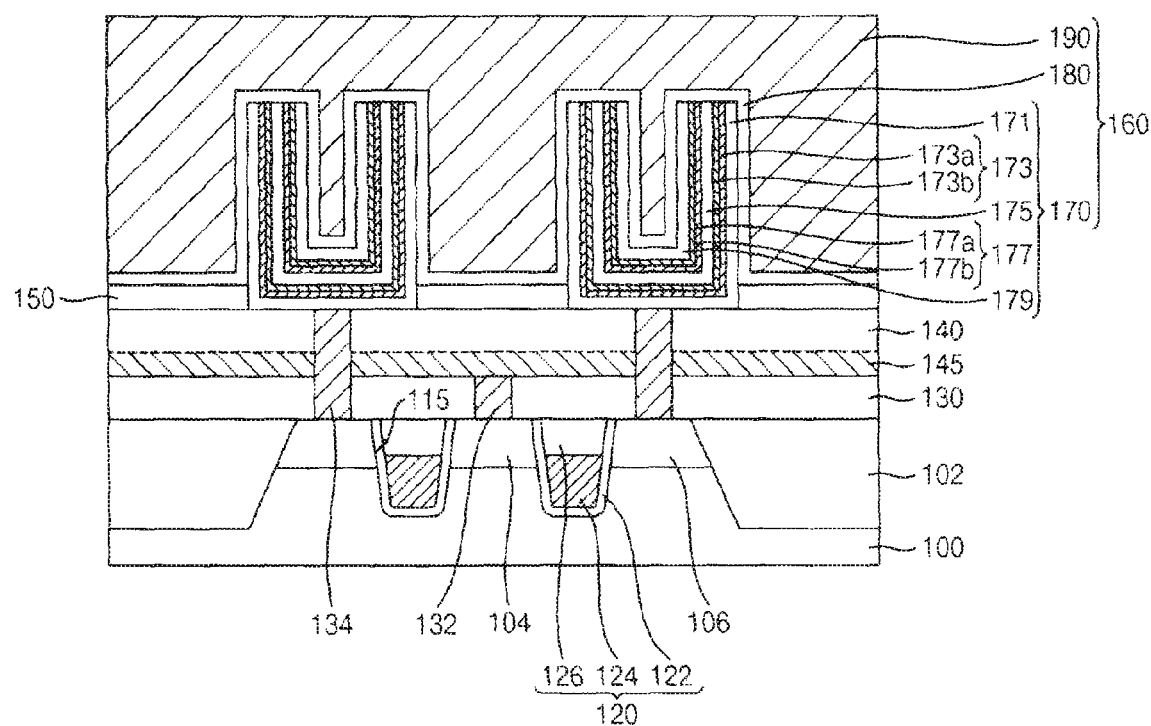
FIGS. 1 to 18 represent non-limiting, example embodiments as described herein.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a semiconductor device in accordance with example embodiments.

Referring to FIG. 1, the semiconductor device may include a transistor on a substrate 100 and a capacitor 160 electrically connected to the transistor. The semiconductor device may further include a first contact plug 132, a second contact plug 134, a bit line 145, a first insulating interlayer 130, a second insulating interlayer 140, and an etch stop layer 150.

The substrate 100 may include silicon, germanium, silicon-germanium, and/or III-IV compound semiconductor, e.g., GaP, GaAs, GaSb, or the like. In some example embodiments, the substrate 100 may be a silicon-on-insulator (SOI) substrate or a germanium-on-insulator (GOI) substrate. The substrate 100 may be divided into an active region and a field region by an isolation layer 102 thereon.

A trench 115 extending in a direction may be formed on the substrate 100 and the isolation layer 102. In some example embodiments, a bottom of the trench 115 may be higher than a bottom of the isolation layer 102.

The transistor may include a buried gate structure 120, a first impurity region 104, and a second impurity region 106.

The buried gate structure 120 may fill the trench 115. A top surface of the buried gate structure 120 may be substantially coplanar with a top surface of the isolation layer 102. The buried gate structure 120 may include a gate insulation pattern 122, a gate electrode, and a capping pattern 126.

The gate insulation pattern 122 may be formed on an inner of the trench 115. The gate insulation pattern 122 may include an oxide, e.g., silicon oxide, a metal oxide, or the like.

The gate electrode 124 may be formed on the gate insulation pattern 122, and may fill a lower portion of the trench 115. The gate electrode 124 may include a metal, e.g., tungsten, titanium, aluminum, or the like. Alternatively, the gate electrode 124 may include a metal nitride, e.g., tungsten nitride, titanium nitride, aluminum nitride, or the like, or doped polysilicon.

The capping pattern 126 may be formed on the gate electrode 124, and may fill an upper portion of the trench 115. The capping pattern 126 may include a nitride, e.g., silicon nitride, silicon oxynitride, or the like.

The first and second impurity regions 104 and 106 may be formed at upper portions of the substrate 100 adjacent to the buried gate structure 120. Each of the first and second impurity regions 104 and 106 may serve as a source region or a drain region of the transistor.

The first insulating interlayer 130 may be formed on the substrate 130, and may cover the buried gate structure 120. The first insulating interlayer 130 may include silicon oxide, e.g., plasma enhanced oxide (PEOX), boro-tetraethyl orthosilicate (BTEOS), boro-phospho tetraethyl orthosilicate (BPTEOS), boro-silicate glass (BSG), phospho silicate glass (PSG), boro-phospho silicate glass (BPSG), or the like.

The first contact plug 132 may be formed through the first insulating interlayer 130, and may contact a top surface of the first impurity region 104. The first contact plug 132 may serve as a bit line contact plug.

The bit line 145 may be formed on the first insulating interlayer 130, and may contact a top surface of the first contact plug 132. The second insulating interlayer 140 may be formed on the first insulating interlayer 130, and may cover the bit line 145. The second insulating interlayer 140 may include a material substantially the same as or similar to that of the first insulating interlayer 130.

The second contact plug 134 may be formed through the first and second insulating interlayers 130 and 140, and may contact a top surface of the second impurity region 106. The second contact plug 134 may serve as a capacitor contact plug.

Each of the first contact plug 132, the second contact plug 134 and the bit line 145 may include a metal, a metal nitride, and/or doped polysilicon.

The etch stop layer 150 may be formed on the second insulating interlayer 140. The capacitor 160 may be formed on a portion of the second insulating interlayer 140 that is not covered by the etch stop layer 150, and may cover a top surface of the second contact plug 134.

The etch stop layer 150 may include a nitride, e.g., silicon nitride, silicon oxynitride, or the like.

The capacitor 160 may include a lower electrode structure 170, a dielectric layer 180, and an upper electrode 190 sequentially stacked on the second insulating interlayer 140.

The lower electrode structure 170 may include a first lower electrode 171, a first oxidation barrier pattern structure 173, a second lower electrode 175, a second oxidation barrier pattern structure 177, and a third lower electrode 179, which may be sequentially stacked on the second insulating interlayer 140. In some example embodiments, the lower electrode structure 170 may have a hollow cylindrical shape. However, the inventive concepts may not be limited thereto. For example, the lower electrode structure 170 may have a shape of a pillar. The lower electrode structure 170 may contact a top surface of the second contact plug 134, and may be electrically connected thereto.

A surface of the first lower electrode 171 and a surface of the third lower electrode 179 may contact the dielectric layer 180. In contrast, opposite surfaces of the second lower electrode 175 may be covered by the first and second oxidation barrier pattern structures 173 and 177, respectively, and thus the dielectric layer 180 may contact only a top surface of the second lower electrode 175.

Each of the first to third lower electrodes 171, 175 and 179 may include a metal, e.g., titanium, tungsten, tantalum, ruthenium, or the like. Alternatively, each of the first to third lower electrodes 171, 175 and 179 may include a metal nitride, e.g., titanium nitride, tungsten nitride, tantalum nitride, or the like.

When the dielectric layer 180 is formed, the first and third lower electrodes 171 and 179 may be oxidized to include oxygen. For example, each of the first and third lower electrodes 171 and 179 may have an oxygen saturation of about 20% to about 60% and a thickness of about 3 Å to about 15 Å.

The first oxidation barrier pattern structure 173 may include first and second oxidation barrier patterns 173a and 173b sequentially stacked on the first lower electrode 171.

In some example embodiments, the first oxidation barrier pattern 173a may include first and second oxidation barrier thin films, which may be stacked sequentially and alternately on the first lower electrode 171. Each of the first and second oxidation barrier film patterns may have a single layer structure or a multi-layered structure. For example, the first oxidation barrier pattern 173a may include the first oxidation barrier film pattern, the second oxidation barrier film pattern, and the first oxidation barrier film pattern, which may be sequentially stacked on the first lower electrode 171. However, the inventive concepts may not be limited thereto. For example, the first oxidation barrier pattern 173a may include the first oxidation barrier film pattern, the second oxidation barrier film pattern, the first oxidation barrier film pattern, and the second oxidation barrier film pattern, which may be sequentially stacked on the first lower electrode 171.

In some example embodiments, the second oxidation barrier film pattern may include a material that may be oxidized more easily than the first oxidation barrier film pattern.

The first oxidation barrier film pattern may include a nitride, e.g., titanium nitride, tantalum nitride, or the like. The second oxidation barrier film pattern may include a nitride, e.g., silicon nitride, tungsten nitride, aluminum nitride, or the like.

The second oxidation barrier pattern 173b may include a structure substantially the same as or similar to that of the first oxidation barrier pattern 173a. That is, the second oxidation barrier pattern 173b may include the first and second oxidation barrier film patterns, which may be sequentially and alternately stacked on the first oxidation barrier pattern 173a. Each of the first and second oxidation barrier film patterns may be formed to have a single layer structure or a multi-layered structure.

In some example embodiments, a total thickness of the second oxidation barrier film patterns in the first oxidation barrier pattern 173a may be greater than that of the second oxidation barrier film patterns in the second oxidation barrier pattern 173b. When a thickness of the second oxidation barrier film pattern is constant, the number of the second oxidation barrier film patterns in the first oxidation barrier pattern 173a may be greater than that in the second oxidation barrier pattern 173b, and thus the total thickness of the second oxidation barrier film patterns in the first oxidation barrier pattern 173a may be greater than that of the second oxidation barrier film patterns in the second oxidation barrier pattern 173b.

The first oxidation barrier film pattern may include a nitride of a first oxidation barrier material, and the second oxidation barrier film pattern may include a nitride of a second oxidation barrier material. The first oxidation barrier material may include, e.g., titanium, tantalum, or the like, and the second oxidation barrier material may include, e.g., silicon, tungsten, aluminum, or the like.

The first oxidation barrier pattern 173a may include the second oxidation barrier material more than that of the second oxidation barrier pattern 173b. The second oxidation barrier material may be oxidized more easily than the first oxidation barrier material, so that the second oxidation barrier material may reduce or prevent the diffusion of oxygen into the second lower electrode 175 better. Thus, the first oxidation barrier pattern 173a including the second oxidation barrier material more than that of the second oxidation barrier pattern 173b may have a higher anti-oxidizing power.

However, the second oxidation barrier material may have an electrical resistance greater than that of the first oxidation barrier material. When the first and second oxidation barrier patterns 173a and 173b only include the second oxidation barrier material, a total resistance of the lower electrode 170 may increase. Accordingly, in the inventive concepts, the first oxidation barrier pattern structure 173 may include both of the first and second oxidation barrier materials, so that the oxidation of the second lower electrode 175 may be reduced or prevented while the total resistance may not increase.

In some example embodiments, the first oxidation barrier pattern structure 173 may further include oxidation barrier patterns in addition to the first and second oxidation barrier patterns 173a and 173b. In this case, a total thickness of the second oxidation barrier film patterns contained in each of the oxidation barrier patterns sequentially stacked on the first lower electrode 171 may decrease gradually from a bottom toward a top thereof. That is, a content of the second oxidation barrier material of each of the oxidation barrier patterns may decrease gradually from a bottom toward a top thereof. Accordingly, an upper oxidation barrier pattern in the first oxidation barrier pattern structure 173 may have a lower anti-oxidizing power and a lower resistance than those of a lower oxidation barrier pattern, respectively, in the first oxidation barrier pattern structure 173.

Like the first oxidation barrier pattern structure 173, the second oxidation barrier pattern structure 177 may include third and fourth oxidation barrier patterns 177a and 177b sequentially stacked on the second lower electrode 175.

In some example embodiments, a total thickness of the second oxidation barrier film patterns in the fourth oxidation barrier pattern 177b may be greater than that of the second oxidation barrier film patterns in the third oxidation barrier pattern 177a. When a thickness of the second oxidation barrier film pattern is constant, the number of the second oxidation barrier film patterns in the fourth oxidation barrier pattern 177b may be greater than that in the third oxidation barrier pattern 177a, and thus the total thickness of the second oxidation barrier film patterns in the fourth oxidation barrier pattern 177b may be greater than that of the second oxidation barrier film patterns in the third oxidation barrier pattern 177a.

The first oxidation barrier film pattern may include a nitride of the first oxidation barrier material, and the second oxidation barrier film pattern may include a nitride of the second oxidation barrier material. The first oxidation barrier material may include, e.g., titanium, tantalum, or the like, and the second oxidation barrier material may include, e.g., silicon, tungsten, aluminum, or the like. The fourth oxidation pattern 177b may include the second oxidation barrier material more than that of the third oxidation barrier pattern 177a.

The second oxidation barrier material may be oxidized more easily than the first oxidation barrier material, so that the second oxidation barrier material may reduce or prevent the diffusion of oxygen into the second lower electrode 175 better. Thus, the fourth oxidation barrier pattern 177b including the second oxidation barrier material more than that of the third oxidation barrier pattern 177a may have a higher anti-oxidizing power.

However, the second oxidation barrier material may have an electrical resistance greater than that of the first oxidation barrier material. When the third and fourth oxidation barrier patterns 177a and 177b only include the second oxidation barrier material, a total resistance of the lower electrode 170 may increase. Accordingly, in the inventive concepts, the second oxidation barrier pattern structure 177 may include both of the first and second oxidation barrier materials, so that the oxidation of the second lower electrode 175 may be reduced or prevented while the total resistance may not increase.

In some example embodiments, the second oxidation barrier pattern structure 177 may further include oxidation barrier patterns in addition to the third and fourth oxidation barrier patterns 177a and 177b. In this case, a total thickness of the second oxidation barrier film patterns contained in each of the oxidation barrier patterns sequentially stacked on the second lower electrode 175 may increase gradually from a bottom toward a top thereof. That is, a content of the second oxidation barrier material of each of the oxidation barrier patterns may increase gradually from a bottom toward a top thereof. Accordingly, an upper oxidation barrier pattern in the second oxidation barrier pattern structure 177 may have a higher anti-oxidizing power and a higher resistance than that of a lower oxidation barrier pattern, respectively, in the second oxidation barrier pattern structure 177.

The dielectric layer 180 may include a metal oxide having a high dielectric constant, e.g., hafnium oxide ($HfO_x$), zirconium oxide ($ZrO_x$), or the like. As will be illustrated with reference to FIGS. 2 to 15, the dielectric layer 180 may be formed by an atomic layer deposition (ALD) process. In the ALD process, the lower electrode structure 170 may be oxidized by ozone ($O_3$) serving as a source gas. When a surface of the lower electrode structure 170 is oxidized, characteristics of the dielectric layer 180 may be enhanced. However, when even an inside of the lower electrode structure 170 is oxidized, the resistance of the lower electrode structure 170 may increase, and thus the characteristics of the semiconductor device having the lower electrode structure 170 may be deteriorated.

However, the first and second oxidation barrier pattern structures 173 and 177 may reduce or prevent the diffusion of oxygen into the second lower electrode 175, so that the second lower electrode 175 may not be oxidized. That is, the first and third lower electrodes 171 and 179 directly contacting the dielectric layer 180 may be oxidized by ozone ($O_3$), however, the second lower electrode 175 covered by the first and second oxidation barrier pattern structures 173 and 177 may not be oxidized.

For example, when the first oxidation barrier pattern structure 173 including the first and second oxidation barrier patterns 173*a* and 173*b* covers a surface of the second lower electrode 175, the first oxidation barrier pattern 173*a* including the second oxidation barrier material more than the first oxidation barrier material may reduce or prevent the oxidation of the second lower electrode 175 effectively. Additionally, the second oxidation barrier pattern 173*b* including the first oxidation barrier material more than the second oxidation barrier material may reduce the total resistance of the lower electrode structure 170.

Likewise, when the second oxidation barrier pattern structure 177 including the third and fourth oxidation barrier patterns 177*a* and 177*b* covers another surface of the second lower electrode 175, the fourth oxidation barrier pattern 177*b* including the second oxidation barrier material more than first oxidation barrier material may reduce or prevent the oxidation of the second lower electrode 175 effectively. Additionally, the third oxidation barrier pattern 177*a* including the first oxidation barrier material more than the second oxidation barrier material may reduce the total resistance of the lower electrode structure 170.

In other words, the first and fourth oxidation barrier patterns 173*a* and 177*b* adjacent to the dielectric layer 180 may include a large amount of the second oxidation barrier material which may be oxidized easily, so that the first and fourth oxidation barrier patterns 173*a* and 177*b* may be sufficiently oxidized during the process for forming the dielectric layer 180. Accordingly, the diffusion of oxygen into the second lower electrode 175 may be reduced or prevented effectively. On the other hand, the second and third oxidation barrier patterns 173*b* and 177*a* directly contacting the second lower electrode 175 may include a large amount of the first oxidation barrier material having a low resistance, so that the second and third oxidation barrier patterns 173*b* and 177*a* may reduce or prevent the resistance of the second lower electrode 175 from increasing.

The lower electrode structure 170 may include the first and fourth oxidation barrier patterns 173*a* and 177*b* reducing or preventing the oxidation of the second lower electrode 175, and the second and third oxidation barrier patterns 173*b* and 177*a* inhibiting the increase of the resistance. Accordingly, the lower electrode structure 170 may have a low resistance. Additionally, the first and third lower electrodes 171 and 179 may be sufficiently oxidized, and thus the dielectric layer 180 contacting the first and third lower electrodes 171 and 179 may have good characteristics.

The upper electrode 190 may include a metal, e.g., titanium, tungsten tantalum, or the like. Alternatively, the upper electrode 190 may include a metal nitride, e.g., titanium nitride, tungsten nitride, tantalum nitride, or the like.

FIGS. 2 to 17 are cross-sectional views illustrating a method of manufacturing the semiconductor device shown in FIG. 1.

Figure 2:

Referring to FIG. 2, an isolation layer 102 may be formed on a substrate 100.

The substrate 100 may include silicon, germanium, silicon-germanium, and/or III-IV compound semiconductor, e.g., GaP, GaAs, GaSb, or the like. In some example embodiments, the substrate 100 may be an SOI substrate or a GOI substrate.

The isolation layer 102 may include silicon oxide. The isolation layer 102 may be formed on the substrate 100 by, e.g., a shallow trench isolation (STI) process. The substrate 100 may be divided into an active region and a field region by the isolation layer 102.

Figure 3:
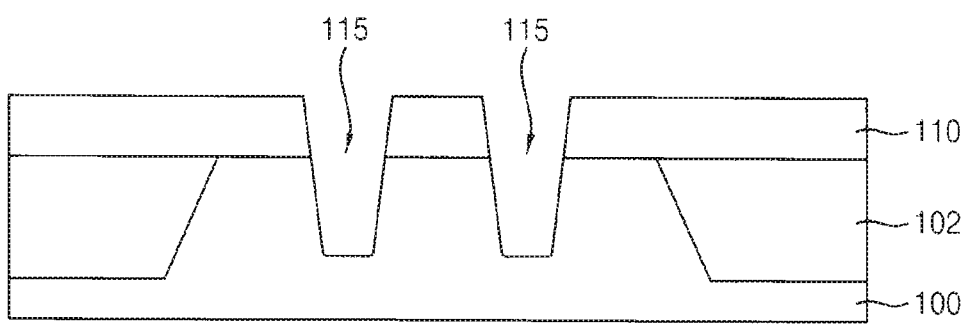

Referring to FIG. 3, a mask pattern 110 may be formed on the substrate 100 and the isolation layer 102, and a trench 115 may be formed on the substrate 100.

A mask layer (not shown) and a photoresist pattern (not shown) may be sequentially formed on the substrate 100 and the isolation layer 102. Using the photoresist pattern, the mask layer may be partially etched to form the mask pattern 110. The mask layer may be formed of silicon nitride by a process, e.g., a chemical vapor deposition (CVD) process, a low pressure chemical vapor deposition (LPCVD) process, a plasma enhanced chemical vapor deposition (PECVD) process, a spin coating process, or the like.

An etching process may be performed using the mask pattern 110 as an etching mask to form the trench 115 on the substrate 100. The etching process may include, e.g., a dry etch process using chlorine gas, a reactive ion etching (RIE) process, or the like. In some example embodiments, the trench 115 may have a bottom higher than that of the isolation layer 102. Accordingly, neighboring elements may be insulated from each other effectively.

Figure 4:
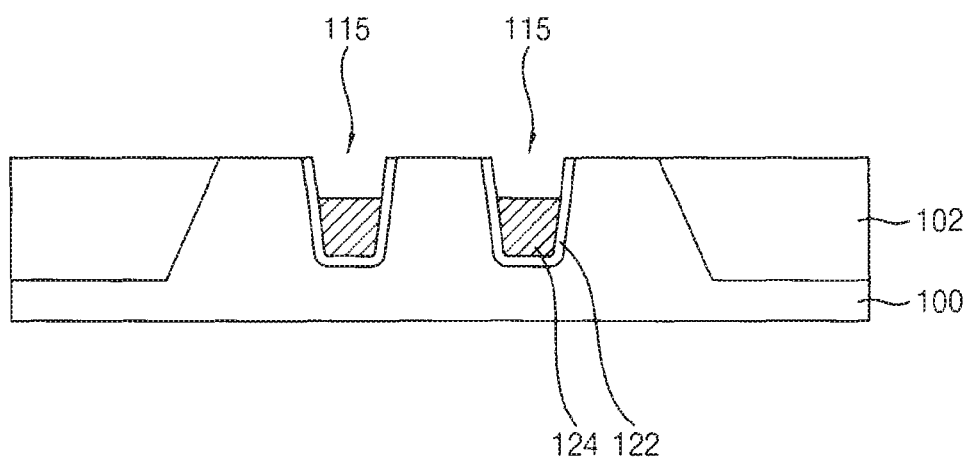

Referring to FIG. 4, a gate insulation pattern 122 may be formed on an inner wall of the trench 115, and a gate electrode 124 may be formed on the gate insulation pattern 122 to partially fill the trench 115.

In some example embodiments, the gate insulation pattern 122 may be formed by thermally oxidizing a portion of the substrate 100 exposed by the trench 115. The gate insulation pattern 122 formed by the thermally oxidizing process may have a good resistance to etching, and may have little crystal defect therein. The gate insulation pattern 122 may include silicon oxide.

A conductive layer may be formed on the gate insulation pattern 122 and the mask pattern 110 to fill a remaining portion of the trench 115. The conductive layer may include a metal, e.g., tungsten, titanium, aluminum, or the like.

Alternatively, the conductive layer may include a metal nitride, e.g., tungsten nitride, titanium nitride, aluminum nitride, or the like. The conductive layer may be formed by a process, e.g., a CVD process, an ALD process, a physical vapor deposition (PVD) process, or the like. In some example embodiments, the conductive layer may be formed of doped polysilicon.

The conductive layer and the mask pattern 110 may be planarized by performing a chemical mechanical polishing (CMP) process until a top surface of the substrate 100 may be exposed. An upper portion of the conductive layer may be partially removed by an etch-back process to form the gate electrode 124 filling a lower portion of the trench 115.

Figure 5:
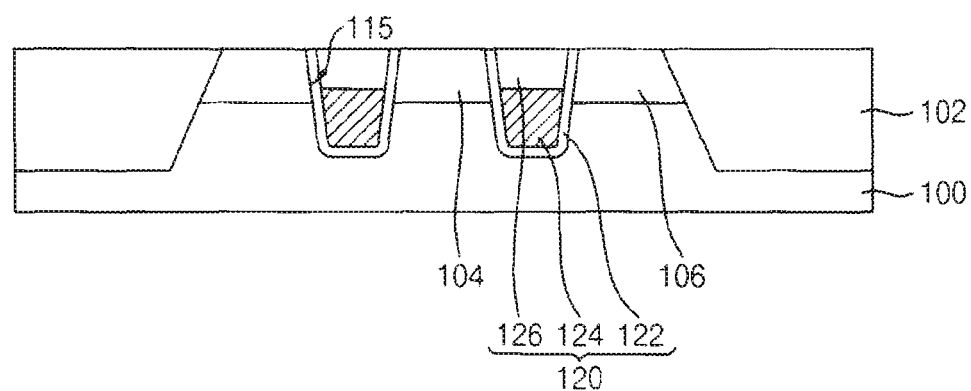

Referring to FIG. 5, a capping layer may be formed on the gate electrode 124, the gate insulation pattern 122, and the substrate 100 to sufficiently fill a remaining portion of the trench 115. The capping layer may be planarized until a top surface of the substrate 100 may be exposed to form a capping pattern 126.

The capping layer may include a nitride, e.g., silicon nitride, silicon oxynitride, or the like. The capping layer may be formed by a process, e.g., a CVD process, an ALD process, a spin coating process, or the like.

The gate insulation pattern 122, the gate electrode 124, and the capping pattern 126 may define a buried gate structure 120.

First and second impurity regions 104 and 106 may be formed at upper portions of the substrate 100 adjacent to the buried gate structure 120 by an ion implantation process.

The buried gate structure 120, the first impurity region 104, and the second impurity region 106 may define a transistor. The first and second impurity regions 104 and 106 may serve as a source region and a drain region of the transistor, respectively.

Figure 6:
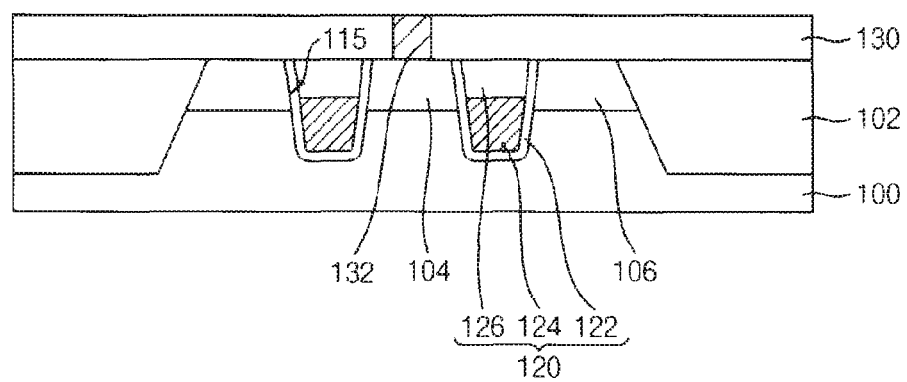

Referring to FIG. 6, a first insulating interlayer 130 may be formed on the substrate 100 to cover the buried gate structure 120. The first insulating interlayer 130 may include silicon oxide, e.g., plasma enhanced oxide (PEOX), boro tetraethyl orthosilicate (BTEOS), plasma tetraethyl orthosilicate (PTEOS), boro-phospho tetraethyl orthosilicate (BPTEOS), boro-silicate glass (BSG), phospho silicate glass (PSG), boro-phospho silicate glass (BPSG), or the like. The first insulating interlayer 130 may be formed by, e.g., a CVD process, an ALD process, or the like.

A first contact plug 132 may be formed through the first insulating interlayer 130 to contact the first impurity region 104.

For example, the first insulating interlayer 130 may be partially removed to form a first hole (not shown) therethrough exposing the first impurity region 104. A first conductive layer may be formed on the exposed first impurity region 104 and the first insulating interlayer 130 to sufficiently fill the first hole. The first conductive layer may be planarized until a top surface of the first insulating interlayer 130 may be exposed to form the first contact plug 132. The first conductive layer may include a metal, e.g., tungsten, copper, aluminum, or the like, or a nitride thereof. The first conductive layer may be formed by, e.g., a CVD process, an ALD process, a PVD process, or the like. In some example embodiments, the planarization process may include a CMP process and/or an etch-back process.

Figure 7:
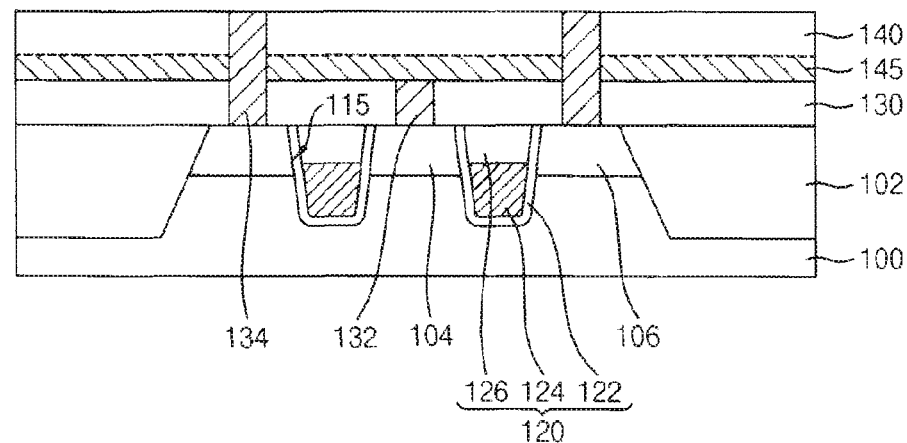

Referring to FIG. 7, a bit line 145 may be formed on the first insulating interlayer 130 to be electrically connected to the first contact plug 132.

For example, a second conductive layer may be formed on the first insulating interlayer 130 to contact the first contact plug 132. The second conductive layer may be patterned to form the bit line 145. The first contact plug 132 contacting the bit line 145 may serve as a bit line contact plug.

A second insulating interlayer 140 may be formed on the first insulating interlayer 130 to cover the bit line 145. The second insulating interlayer 140 may include silicon oxide, e.g., PEOX, BTEOS, PTEOS, BPTEOS, BSG, PSG, BPSG, or the like. The second insulating interlayer 140 may be formed by, e.g., a CVD process, an ALD process, or the like.

A second contact plug 134 may be formed through the first and second insulating interlayers 130 and 140 to contact the second impurity region 106. For example, the first and second insulating interlayers 130 and 140 may be partially removed to form a second hole (not shown) therethrough exposing the second impurity region 106. A third conductive layer may be formed on the exposed second impurity region 106 and the second insulating interlayer 140 to sufficiently fill the second hole. The third conductive layer may be planarized until a top surface of the second insulating interlayer 140 may be exposed to form the second contact plug 134.

The second contact plug 134 may contact a capacitor 160 (refer to FIG. 1), and may serve as a capacitor contact plug.

Each of the second and third conductive layers may be formed of a metal and/or a metal nitride by, e.g., a CVD process, an ALD process, a PVD process, or the like.

Figure 8:
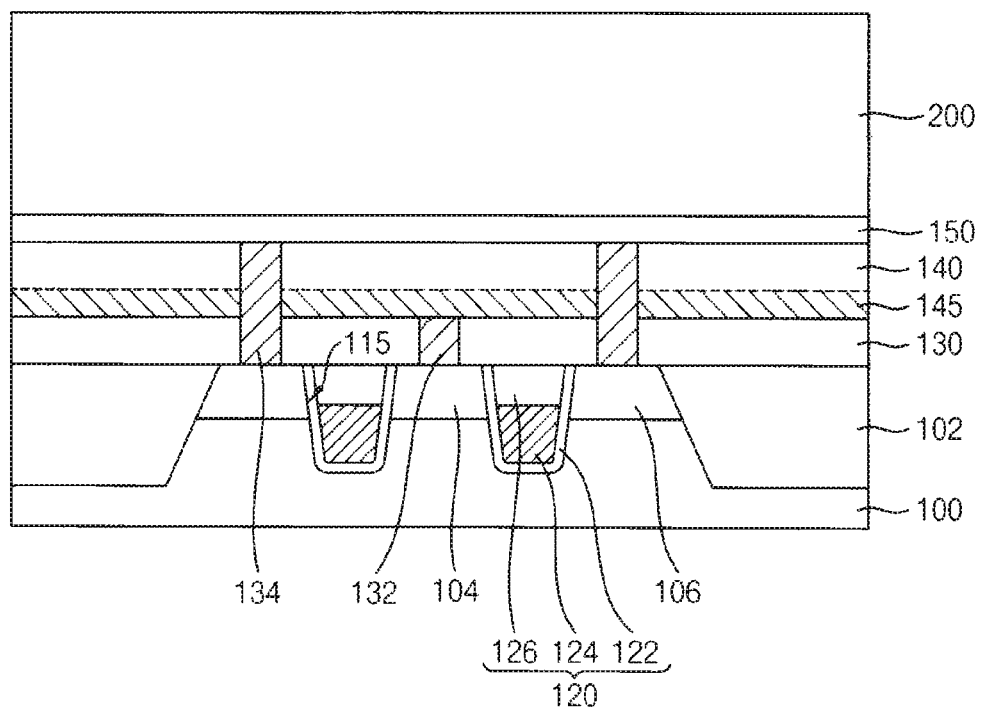

Referring to FIG. 8, an etch stop layer 150 and a mold layer 200 may be sequentially formed on the second insulating interlayer 140 and the second contact plug 134.

The etch stop layer 150 may include a nitride, e.g., silicon nitride, silicon oxynitride, or the like. The mold layer 200 may include silicon oxide, e.g., BSG, BPSG, TEOS, USG, or the like. Each of the etch stop layer 150 and the mold layer 200 may be formed by, e.g., a CVD process, an ALD process, or the like.

Figure 9:
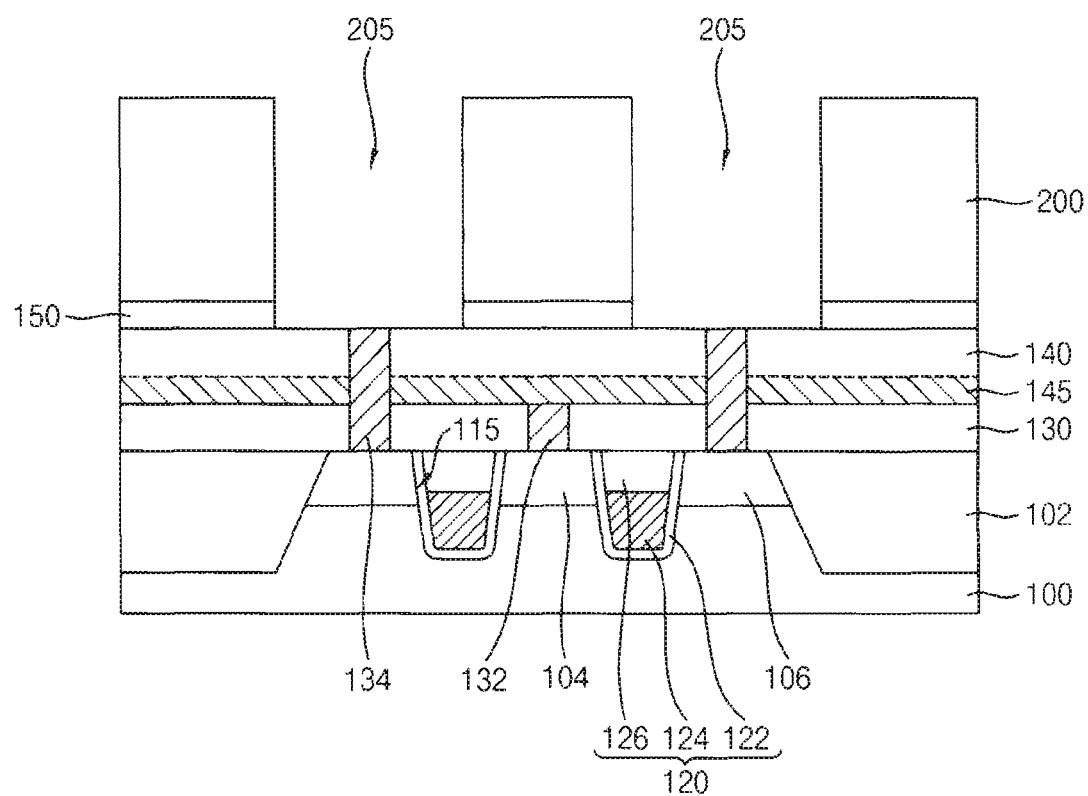

Referring to FIG. 9, the mold layer 200 and the etch stop layer 150 may be partially removed to form an opening 205 therethrough exposing a top surface of the second contact plug 134.

The opening 205 may be formed by, e.g., a dry etch process. In some example embodiments, the opening 205 may have a uniform width along a vertical direction. Alternatively, due to the characteristics of a dry etch process, the opening 205 may have a width gradually decreasing from a top toward a bottom thereof, and thus the opening 205 may have an inclined sidewall.

Figure 10:
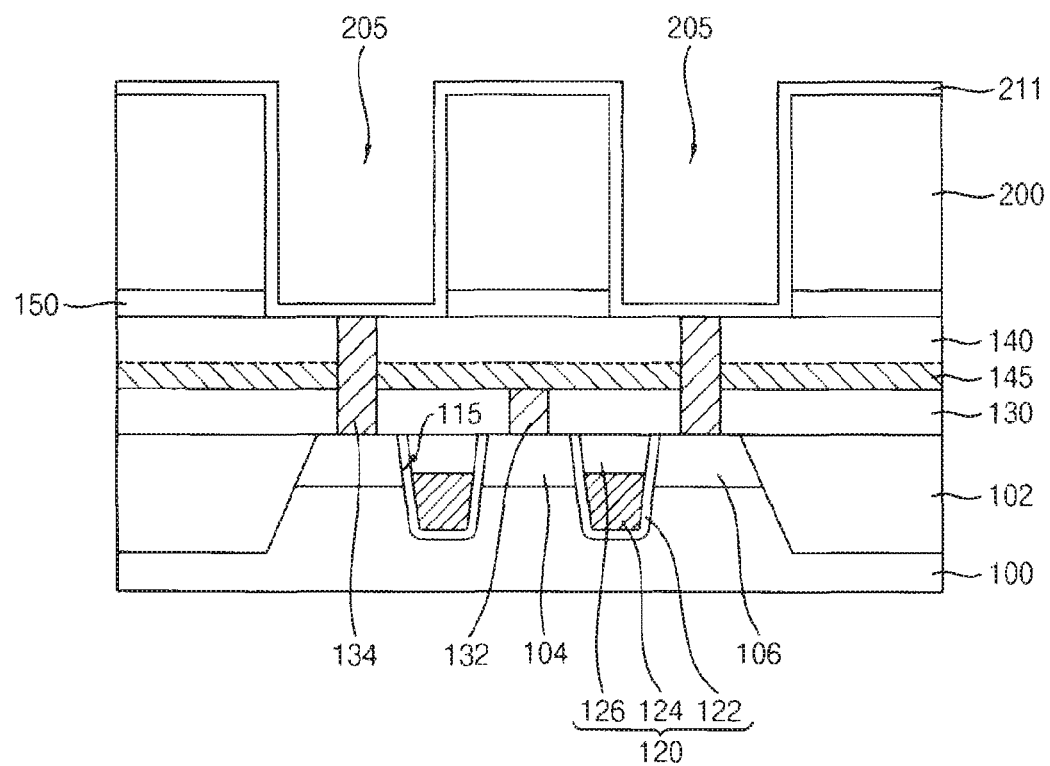

Referring to FIG. 10, a first lower electrode layer 211 may be formed on the exposed top surface of the second contact plug 134, a sidewall of the opening 205, and the mold layer 200.

The first lower electrode layer 211 may include a metal, e.g., titanium, tungsten, tantalum, ruthenium, or the like. Alternatively, the first lower electrode layer 211 may include a metal nitride, e.g., titanium nitride, tungsten nitride, tantalum nitride, or the like. The first lower electrode layer 211 may be formed by, e.g., an ALD process, a CVD process, or the like.

Figure 11:
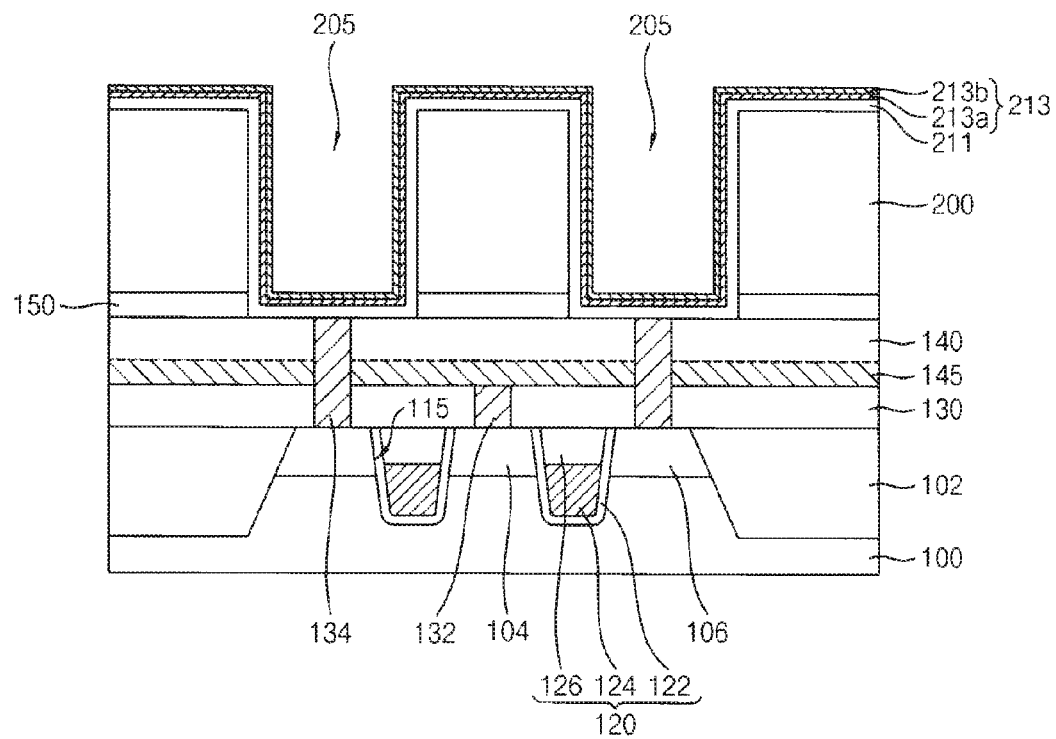

Referring to FIG. 11, a first oxidation barrier layer 213*a* and a second oxidation barrier layer 213*b* may be sequentially formed on the first lower electrode layer 211 to form a first oxidation barrier layer structure 213.

In some example embodiments, first and second oxidation barrier films may be formed sequentially and alternately on the first lower electrode layer 211 to form the first oxidation barrier layer 213*a*. Each of the first and second oxidation barrier films may be formed to have a single layer structure or a multi-layered structure. For example, the first oxidation barrier layer 213*a* may include the first oxidation barrier film, the second oxidation barrier film, and the first oxidation barrier film, which may be sequentially stacked on the first lower electrode layer 211. However, the inventive concepts may not be limited thereto. For example, the first oxidation barrier layer 213*a* may include the first oxidation barrier film, the second oxidation barrier film, the first oxidation barrier film, and the second oxidation barrier film, which may be sequentially stacked on the first lower electrode layer 211.

In some example embodiments, each of the first and second oxidation barrier films may be formed by an ALD process. In some example embodiments, the second oxidation barrier film may include a material that may be oxidized more easily than the first oxidation barrier film.

The first oxidation barrier film may include a nitride of a first oxidation barrier material, e.g., titanium nitride, tantalum nitride, or the like. The second oxidation barrier film may include a nitride of a second oxidation barrier material, e.g., silicon nitride, tungsten nitride, aluminum nitride, or the like.

The second oxidation barrier layer 213*b* may be formed by processes substantially the same as or similar to those of the first oxidation barrier layer 213*a*. That is, the second oxidation barrier layer 213*b* may include the first and second oxidation barrier films, which may be sequentially and alternately stacked on the first oxidation barrier layer 213*a*. Each of the first and second oxidation barrier films may be formed to have a single layer structure or a multi-layered structure.

A total thickness of the second oxidation barrier films in the first oxidation barrier layer 213*a* may be greater than that of the second oxidation barrier films in the second oxidation barrier layer 213*b*. When a thickness of the second oxidation barrier film is constant, the number of the second oxidation barrier films in the first oxidation barrier layer 213*a* may be greater than that of the second oxidation barrier films in the second oxidation barrier layer 213*b*. Accordingly, the total thickness of the second oxidation barrier film in the first oxidation barrier pattern 213*a* may be greater than that of the second oxidation barrier films in the second oxidation barrier layer 213*b*.

The second oxidation barrier material may be oxidized more easily than the first oxidation barrier material, so that the second oxidation barrier material may reduce or prevent the diffusion of oxygen into the second lower electrode 175 better. Thus, the first oxidation barrier layer 213*a* including the second oxidation barrier material more than that of the second oxidation barrier layer 213*b* may have a higher anti-oxidizing power.

In some example embodiments, the first oxidation barrier layer structure 213 may further include oxidation barrier layers in addition to the first and second oxide barrier layers 213*a* and 213*b*. In this case, a total thickness of the second oxidation barrier films contained in each of the oxidation barrier layers sequentially stacked on the first lower electrode layer 211 may decrease gradually from a bottom toward a top thereof. That is, a content of the second oxidation barrier material of each of the oxidation barrier layers may decrease gradually from a bottom toward a top thereof. Accordingly, an upper oxidation barrier layer in the first oxidation barrier layer structure 213 may have a lower anti-oxidizing power and a lower resistance than those of a lower oxidation barrier layer in the first oxidation barrier layer structure 213.

Figure 12:
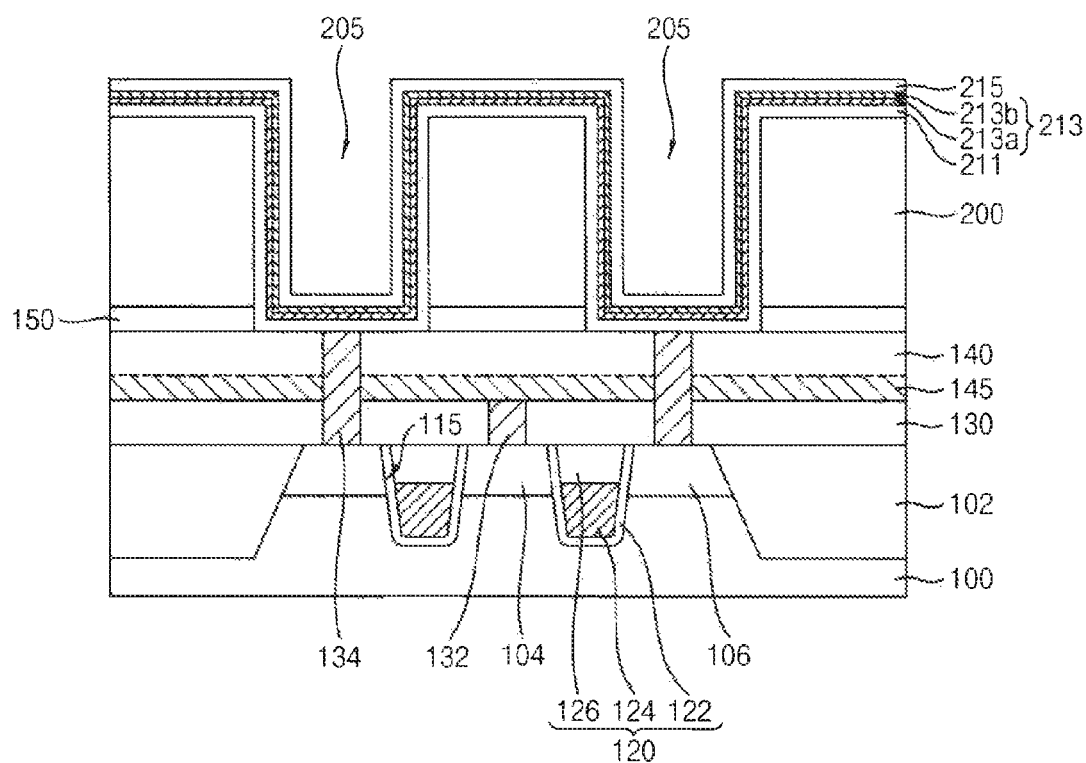

Referring to FIG. 12, a second lower electrode layer 215 may be formed on the first oxidation barrier layer structure 213. The second lower electrode layer 215 may be formed by processes substantially the same as or similar to those of the first lower electrode layer 211.

Figure 13:
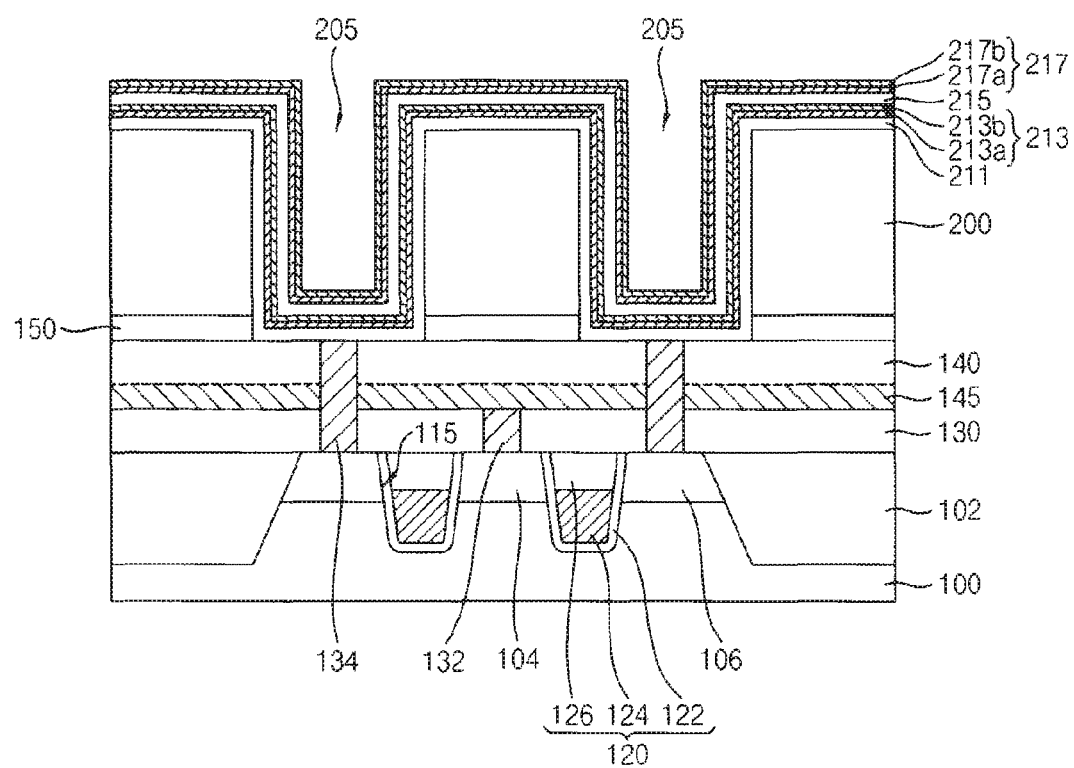

Referring to FIG. 13, a third oxidation barrier layer 217*a* and a fourth oxidation barrier layer 217*b* may be sequentially formed on the second lower electrode layer 215 to form a second oxidation barrier layer structure 217. The second oxidation barrier layer structure 217 may be formed by processes substantially the same as or similar to those of the first oxidation barrier layer structure 213.

A total thickness of the second oxidation barrier films in the fourth oxidation barrier layer 217*b* may be greater than that of the second oxidation barrier films in the third oxidation barrier layer 217*a*. When a thickness of the second oxidation barrier film is constant, the number of the second oxidation barrier film in the fourth oxidation barrier layer 217*b* may be greater than that of the second oxidation barrier films in the third oxidation barrier layer 217*a*. Accordingly, the total thickness of the second oxidation barrier film in the fourth oxidation barrier layer 217*b* may be greater than that of the second oxidation barrier films in the third oxidation barrier layer 217*a*.

The second oxidation barrier material may be oxidized more easily than the first oxidation barrier material, so that the second oxidation barrier material may reduce or prevent the diffusion of oxygen into the second lower electrode layer 215 better. Thus, the fourth oxidation barrier layer 217*b* including the second oxidation barrier material more than that of the third oxidation barrier layer 217*a* may have a higher anti-oxidizing power.

In some example embodiments, the second oxidation barrier layer structure 217 may further include oxidation barrier layers in addition to the third and fourth oxidation barrier layers 217*a* and 217*b*. In this case, a total thickness of the second oxidation barrier films contained in each of the oxidation barrier layers sequentially stacked on the second lower electrode layer 215 may increase gradually from a bottom toward a top thereof. That is, a content of the second oxidation barrier material of each of the oxidation barrier layers may increase gradually from a bottom toward a top thereof. Accordingly, an upper oxidation barrier layer in the second oxidation barrier layer structure 217 may have a higher anti-oxidizing power and a higher resistance than those of a lower oxidation barrier layer in the second oxidation barrier layer structure 217.

Figure 14:
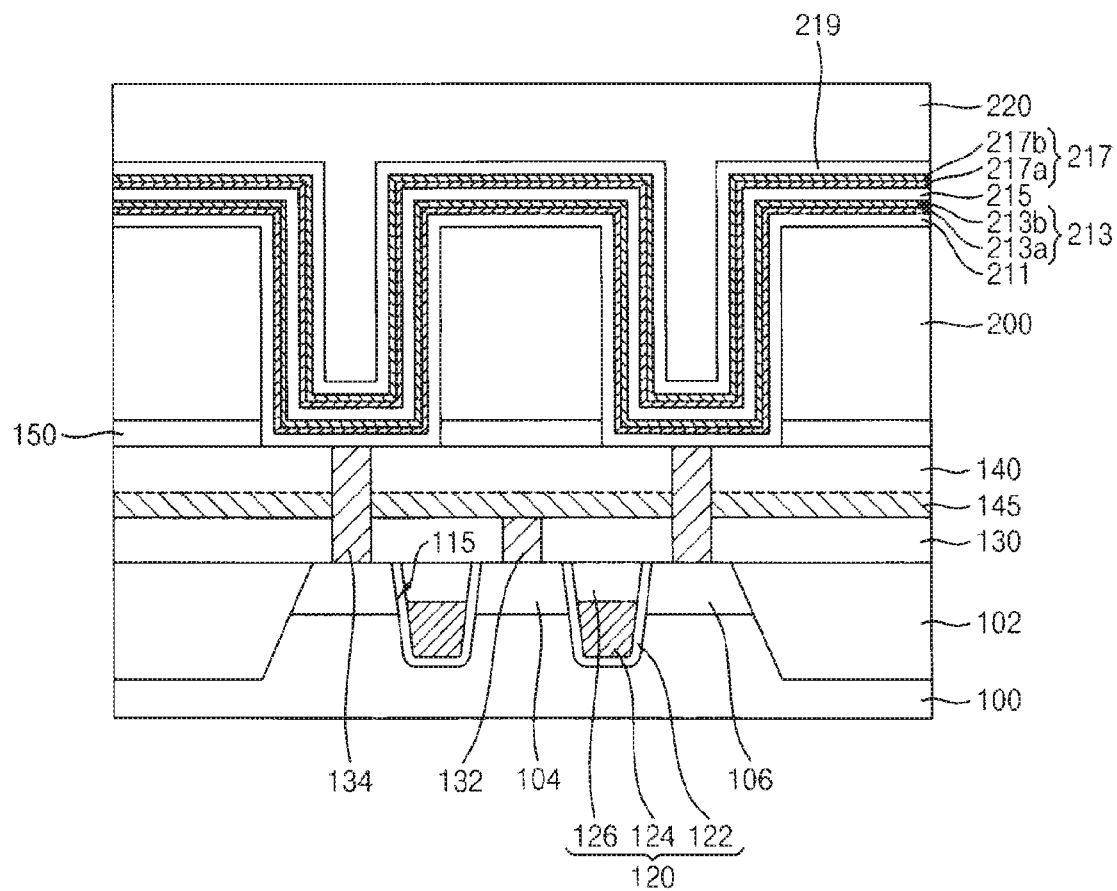

Referring to FIG. 14, a third lower electrode layer 219 may be formed on the second oxidation barrier layer structure 217. A sacrificial layer 220 may be formed on the third lower electrode layer 219 to fill a remaining portion of the opening 205.

The third lower electrode layer 219 may be formed by processes substantially the same as or similar to those of the first lower electrode layer 211. The sacrificial layer 220 may include silicon oxide, e.g., BSG, BPSG, TEOS, USG, or the like.

Figure 15:
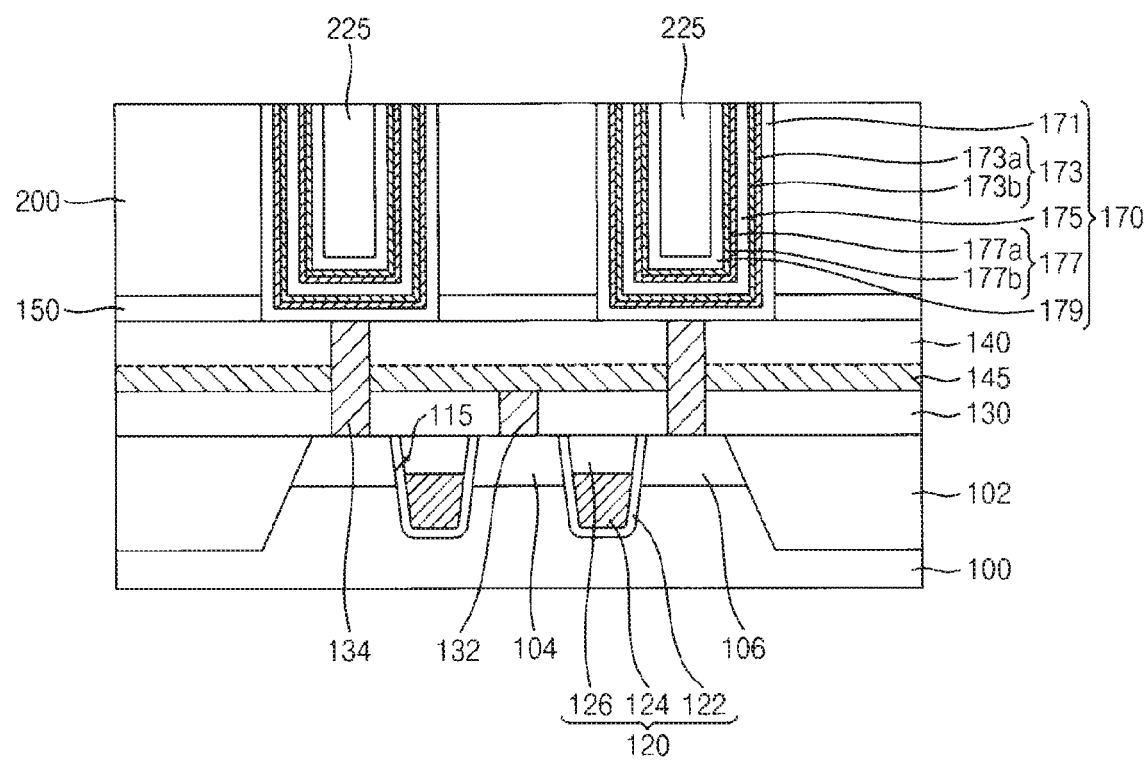

Referring to FIG. 15, the sacrificial layer 220, the third lower electrode layer 219, the second oxidation barrier layer structure 217, the second lower electrode layer 215, the first oxidation barrier layer structure 213, and the first lower electrode layer 211 may be planarized until a top surface of the mold layer 200 may be exposed to form a sacrificial pattern 225 and a lower electrode structure 170. In some example embodiments, the planarization process may include a CMP process and/or an etch-back process.

The lower electrode structure 170 may include a first lower electrode 171, a first oxidation barrier pattern structure 173, a second electrode 175, a second oxidation barrier pattern structure 177, and a third lower electrode 179, which may be sequentially stacked on the exposed top surface of the second contact plug 134.

The first oxidation barrier pattern structure 173 may include first and second oxidation barrier patterns 173a and 173b sequentially stacked on the first lower electrode 171. The second oxidation barrier pattern structure 177 may include third and fourth oxidation barrier patterns 177a and 177b sequentially stacked on the second lower electrode 175. Each of the first to fourth oxidation barrier patterns 173a, 173b, 177a, and 177b may include first and second oxidation barrier film patterns alternately stacked. Each of the first and second oxidation barrier film patterns may have a single layer structure or a multi-layered structure.

Figure 16:
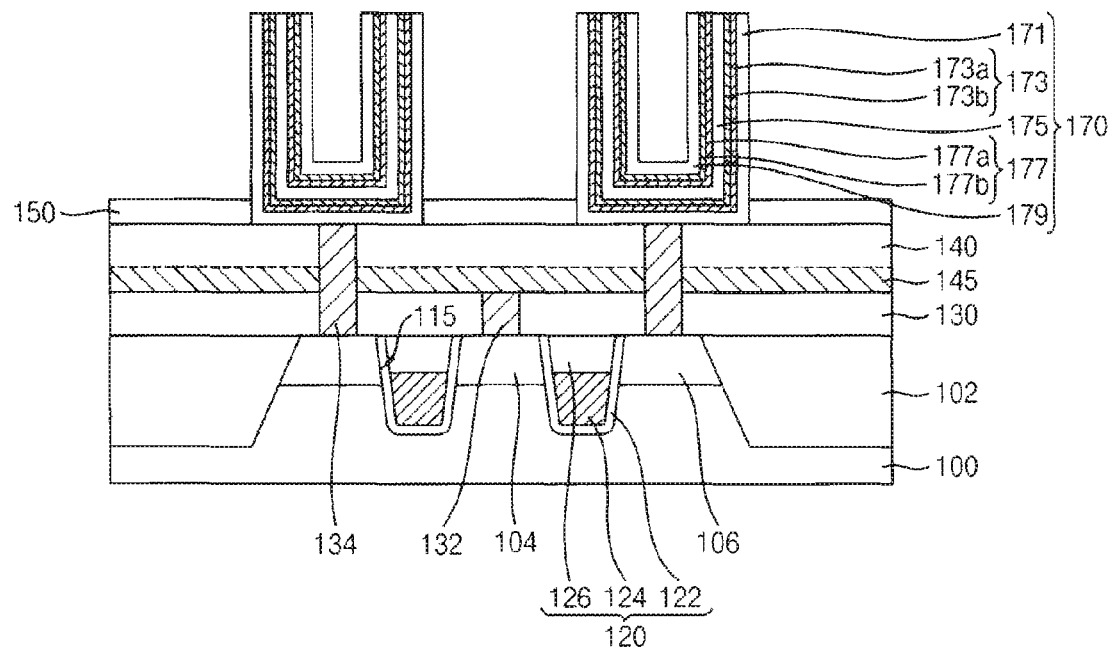

Referring to FIG. 16, the sacrificial pattern 205 and the mold layer 200 may be removed.

For example, the sacrificial pattern 205 and the mold layer 200 may be removed by a wet etch process using a low ammonium fluoride liquid (LAL) as an etchant. The LAL may be a mixture of ammonium fluoride ($NH_4F$), hydrogen fluoride (HF), and/or water ($H_2O$). Accordingly, surfaces of the lower electrode structure 170 and a top surface of the etch stop layer 150 may be exposed.

Figure 17:
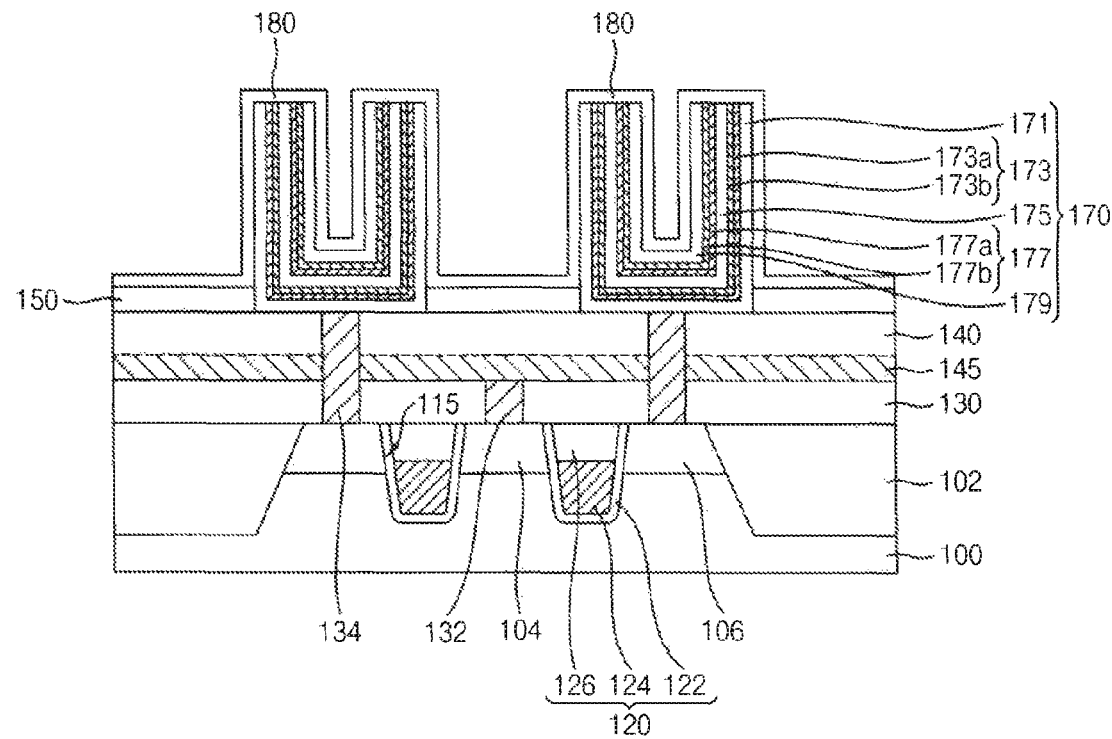

Referring to FIG. 17, a dielectric layer 180 may be formed on the exposed surfaces of the lower electrode structure 170 and the top surface of the etch stop layer 150.

The dielectric layer 180 may include a metal oxide having a high dielectric constant, e.g., hafnium oxide ($HfO_x$), zirconium oxide ($ZrO_x$), or the like. The dielectric layer 180 may be formed by, e.g., a CVD process, an ALD process, or the like.

For example, when the dielectric layer 180 including hafnium oxide is formed by an ALD process, a hafnium source gas such as $HfCl_4$ and/or $Hf(NO_3)_4$, and an oxygen source gas such as $H_2O$, $O_3$, $O_2$ may be used. A deposition process using the source gas and a purging process may be performed repeatedly to form the dielectric layer 180 having a desired thickness.

When the ALD process is performed, the lower electrode structure 170 may be oxidized by the source gas such as $O_3$. When a surface of the lower electrode structure 170 is oxidized, the characteristics of the dielectric layer 180 may be enhanced. However, when even an inside of the lower electrode structure 170 is oxidized, a resistance of the lower electrode structure 170 may increase, and thus the characteristics of the semiconductor device having the lower electrode structure 170 may be deteriorated.

However, in some example embodiments, the first and second oxidation barrier pattern structures 173 and 177 may block the diffusion of oxygen into the second lower electrode 175, so that the second lower electrode 175 may not be oxidized. That is, the first and third lower electrodes 171 and 179 directly contacting the dielectric layer 180 may be oxidized by ozone ($O_3$), however, the second lower electrode 175 covered by the first and second oxidation barrier pattern structures 173 and 177 may not be oxidized.

For example, when the first oxidation barrier pattern structure 173 including the first and second oxidation barrier patterns 173a and 173b is formed beneath the second lower electrode 175, the first oxidation barrier pattern 173a including the second oxidation barrier material more than the first oxidation barrier material may reduce or prevent the oxidation of the second lower electrode 175 effectively. Additionally, the second oxidation barrier pattern 173b including the first oxidation barrier material more than the second oxidation barrier material may reduce the total resistance of the lower electrode structure 170.

Likewise, when the second oxidation barrier pattern structure 177 including the third and fourth oxidation barrier patterns 177a and 177b is formed on the second lower electrode 175, the fourth oxidation barrier pattern 177b including the second oxidation barrier material more than the first oxidation barrier material may reduce or prevent the oxidation of the second lower electrode 175 effectively. Additionally, the third oxidation barrier pattern 177a including the first oxidation barrier material more than the second oxidation barrier material may reduce the total resistance of the lower electrode structure 170.

Referring again to FIG. 1, an upper electrode 190 may be formed on the dielectric layer 180 to form a capacitor 160.

The upper electrode 190 may include a metal and/or a metal nitride. The upper electrode 190 may be formed by, e.g., a CVD process, an ALD process, and a PVD process.

Figure 18:
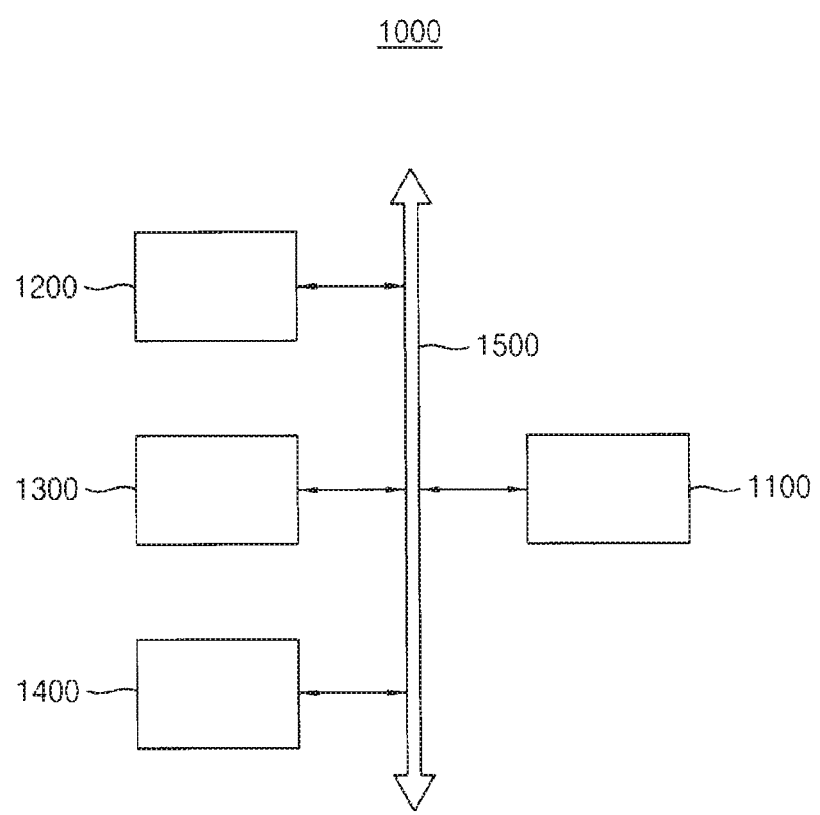

FIG. 18 is a block diagram illustrating a memory system including the semiconductor device shown in FIG. 1.

Referring to FIG. 18, a memory system 1000 may include a memory 1100, a controller 1200, an input/output (I/O) device 1300, an interface 1400, and a bus. The controller 1200 may control the operation of the memory 1100. The I/O device 1300 may receive data and/or signal from an outside of the memory system 1000, and/or may output data and/or signal to the outside of the memory system 1000. The interface 1400 may send data to a communication network and/or receive data from the communication network. The bus 1500 may relay communications between components.

The memory 1100 may include the semiconductor device in accordance with inventive concepts. Alternatively, the memory 1100 may include other types of memory, e.g., non-volatile memory, or the like. The non-volatile memory may perform data erasing, programming, and preserving data even when power is cut off.

The controller 1200 may include at least one microprocessor, at least one digital signal processor, and/or at least one micro controller. The memory 1100 may store instructions performed by the controller 1200.

The I/O device 1300 may include, e.g., a keyboard, a keypad, a display device, or the like.

The memory system 1000 may be applied to, e.g., a computer, a portable computer, a personal portable terminal, a tablet, a cellular phone, a digital music player, or any device capable of sending and/or receiving information in a wireless environment.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A capacitor, comprising:
a lower electrode structure, including:
first to third lower electrodes sequentially stacked;
a first oxidation barrier pattern structure between the first lower electrode and the second lower electrode, the first oxidation barrier pattern structure including first and second oxidation barrier patterns sequentially stacked on the first lower electrode; and
a second oxidation barrier pattern structure between the second lower electrode and the third lower electrode, the second oxidation barrier pattern structure including third and fourth oxidation barrier patterns sequentially stacked on the second lower electrode, each of the first to fourth oxidation barrier patterns including first and second oxidation barrier film patterns sequentially and alternately stacked;
a dielectric layer on the lower electrode structure; and
an upper electrode on the dielectric layer.

2. The capacitor of claim 1, wherein at least one of the first and second oxidation barrier film patterns has a multi-layered structure.

3. The capacitor of claim 1, wherein the first oxidation barrier film pattern includes titanium nitride and/or tantalum nitride.

4. The capacitor of claim 1, wherein the second oxidation barrier film pattern includes silicon nitride, tungsten nitride, and/or aluminum nitride.

5. The capacitor of claim 1, wherein a thickness of the second oxidation barrier film pattern is greater than a thickness of the first oxidation barrier film pattern.

6. The capacitor of claim 1, wherein a thickness of the second oxidation barrier film pattern is smaller than a thickness of the first oxidation barrier film pattern.

7. The capacitor of claim 1, wherein the first oxidation barrier film pattern includes a nitride of a first oxidation barrier material, and the second oxidation barrier film pattern includes a nitride of a second oxidation barrier material, and the second oxidation barrier material having an anti-oxidizing power greater than that of the first oxidation barrier material, and
wherein a total content of the second oxidation barrier material of the second oxidation barrier pattern structure is greater than a total content of the first oxidation barrier material of the first oxidation barrier pattern structure.

8. The capacitor of claim 7, wherein the first oxidation barrier material includes titanium and/or tantalum, and the second oxidation barrier material includes silicon, tungsten, and/or aluminum.

9. The capacitor of claim 1, wherein the first oxidation barrier film pattern includes a nitride of a first oxidation barrier material, and the second oxidation barrier film pattern includes a nitride of a second oxidation barrier material, the second oxidation barrier material having an anti-oxidizing power greater than that of the first oxidation barrier material, and
wherein a total content of the second oxidation barrier material of the second oxidation barrier pattern structure is smaller than a total content of the first oxidation barrier material of the first oxidation barrier pattern structure.

10. The capacitor of claim 9, wherein the first oxidation barrier material includes titanium and/or tantalum, and the second oxidation barrier material includes silicon, tungsten, and/or aluminum.

11. The capacitor of claim 1, wherein each of the first to third lower electrodes include titanium, tungsten, tantalum, titanium nitride, tungsten nitride, and/or tantalum nitride.

12. The capacitor of claim 11, wherein the first and third lower electrodes include more oxygen than the second lower electrode.

13. The capacitor of claim 12, wherein each of the first and third lower electrodes has an oxygen saturation of about 20% to about 60%.

14. The capacitor of claim 1, wherein the lower electrode structure has a cylindrical shape.

15. A capacitor, comprising:
a lower electrode structure, including:
first to third lower electrodes sequentially stacked;
a first oxidation barrier pattern structure between the first lower electrode and the second lower electrode, the first oxidation barrier pattern structure including a first oxidation barrier material and a second oxidation barrier material, the second oxidation barrier material having an anti-oxidizing power greater than that of the first oxidation barrier material, and a content of the second oxidation barrier material of the first oxidation barrier pattern structure decreasing gradually from a bottom toward a top thereof; and
a second oxidation barrier pattern structure between the second lower electrode and the third lower electrode, the second oxidation barrier pattern structure including a third oxidation barrier material and a fourth oxidation barrier material, and a content of the fourth oxidation barrier material of the second oxidation barrier pattern structure increasing gradually from a bottom toward a top thereof;
a dielectric layer on the lower electrode structure; and
an upper electrode on the dielectric layer.

16. The capacitor of claim 15, wherein the first oxidation barrier material includes titanium and/or tantalum, the second oxidation barrier material includes silicon, tungsten, and/or aluminum, and the first and second oxidation barrier pattern structures include nitride, respectively.

17. The capacitor of claim 16, wherein each of the first and second oxidation barrier pattern structures includes a multi-layered structure, and
wherein a total content of the second oxidation barrier material in the first oxidation barrier pattern structure decreases gradually from a bottom toward a top thereof, and a total content of the fourth oxidation barrier material in the second oxidation barrier pattern structure increases gradually from a bottom toward a top thereof.

18. The capacitor of claim 17, wherein,
the first oxidation barrier pattern structure includes first and second oxidation barrier patterns sequentially stacked on the first lower electrode, and
the second oxidation barrier pattern structure includes third and fourth oxidation barrier patterns sequentially stacked on the second lower electrode,
each of the first to fourth oxidation barrier patterns including first and second oxidation barrier film patterns sequentially and alternately stacked.

19. A semiconductor device, comprising:
a transistor on a substrate; and
a capacitor electrically connected to the transistor, the capacitor including:
a lower electrode structure;
a dielectric layer on the lower electrode structure; and
an upper electrode on the dielectric layer,
wherein the lower electrode structure includes, first to third lower electrodes sequentially stacked, the first and third lower electrodes including more oxygen than the second lower electrode;
a first oxidation barrier pattern structure between the first lower electrode and the second lower electrode, the first oxidation barrier pattern structure including first and second oxidation barrier patterns sequentially stacked on the first lower electrode; and
a second oxidation barrier pattern structure between the second lower electrode and the third lower electrode, the second oxidation barrier pattern structure including third and fourth oxidation barrier patterns sequentially stacked on the second lower electrode.

\* \* \* \* \*